United States Patent [19]

Misfeldt

[11] 3,972,755

[45] Aug. 3, 1976

[54] DIELECTRIC CIRCUIT BOARD BONDING

[75] Inventor: Charles C. Misfeldt, China Lake, Calif.

[73] Assignee: The United States of America as represented by the Secretary of the Navy, Washington, D.C.

[22] Filed: Oct. 29, 1974

[21] Appl. No.: 518,314

Related U.S. Application Data

[63] Continuation-in-part of Ser. No. 315,037, Dec. 14, 1972, abandoned, which is a continuation-in-part of Ser. No. 52,868, Dec. 14, 1972, abandoned.

[52] U.S. Cl.................................. 156/3; 29/625; 156/7; 156/18; 156/303.1; 156/309; 156/313; 156/323; 174/68.5
[51] Int. Cl.²...................... C23F 1/02; B29D 3/00; C09J 5/00
[58] Field of Search............ 156/3, 7, 18, 309, 313, 156/323, 8, 153, 154, 245, 250, 256, 267, 288, 298, 303.1, 311, 312, 321; 29/625; 161/186, 217; 174/68.5

[56] References Cited
UNITED STATES PATENTS

| | | | |
|---|---|---|---|
| 2,849,298 | 8/1958 | Werberig | 156/8 X |
| 3,010,863 | 11/1961 | Coe et al. | 156/3 |
| 3,220,897 | 11/1965 | Conley et al. | 161/186 X |
| 3,258,387 | 6/1966 | Brown et al. | 156/3 X |
| 3,361,608 | 1/1968 | Janetos et al. | 161/186 X |
| 3,393,117 | 7/1968 | Zolg et al. | 161/186 X |
| 3,396,457 | 8/1968 | Nordin | 156/3 X |
| 3,496,336 | 2/1970 | Hingorany et al. | 156/3 X |
| 3,556,928 | 1/1971 | Zolg | 161/186 |
| 3,558,423 | 1/1971 | Rossetti | 161/216 X |
| 3,584,376 | 6/1971 | Howe et al. | 156/3 X |
| 3,741,858 | 6/1973 | Fujiwara | 161/186 X |

*Primary Examiner*—William A. Powell
*Attorney, Agent, or Firm*—R. S. Sciascia

[57] ABSTRACT

A method and apparatus is disclosed for bonding of dielectric circuit boards for microwave use, the bonding together of several circuit boards to form subassemblies and the bonding of subassemblies together. The finished circuit may include a bonded-in ground plate of copper wire cloth or the like and may include through-plate holes. The technique includes the build-up of thin films to provide strength, toughness and dimensional accuracy. Orthogonal positioning of directional stresses and cooling under pressure have a stabilizing effect. The bonding of copper or other conductive sheet or foil to the substrate is done without the use of a copper oxide or other coating and using only heat and pressure. An etched circuit in the copper sheet or foil, for example, is made flush with the finished surface of the board in the process. A normal bonding cycle comprises (1) loading the parts to be bonded in a confining mold, (2) placing a conforming mold plate within the mold and closing the parts in a press, (3) pressing for a predetermined time at a predetermined elevated temperature and (4) shock cooling the material before removing pressure from the mold.

13 Claims, 5 Drawing Figures

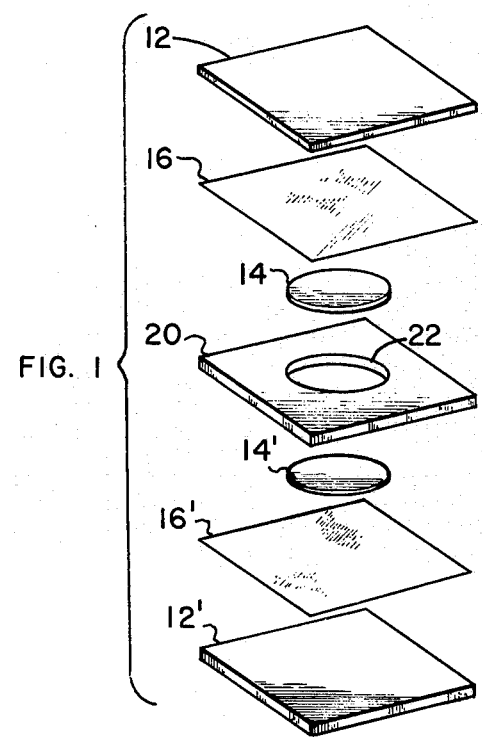
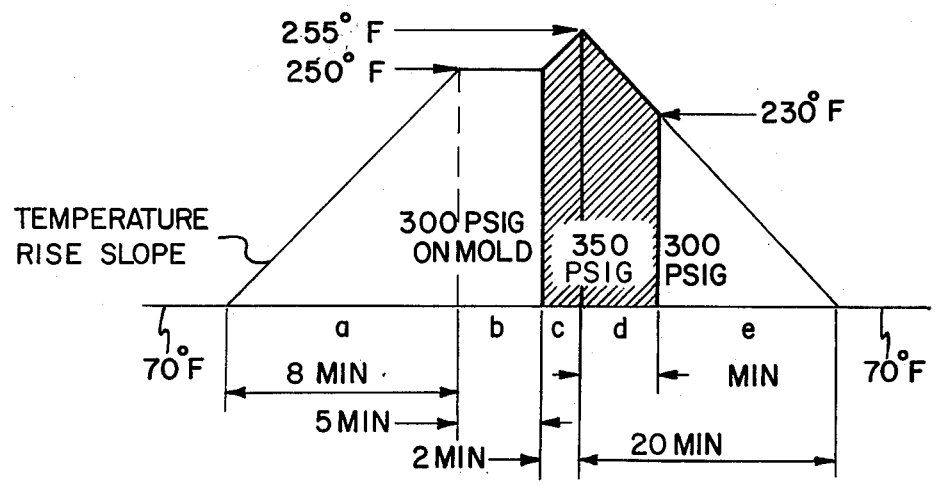
FIG. 2

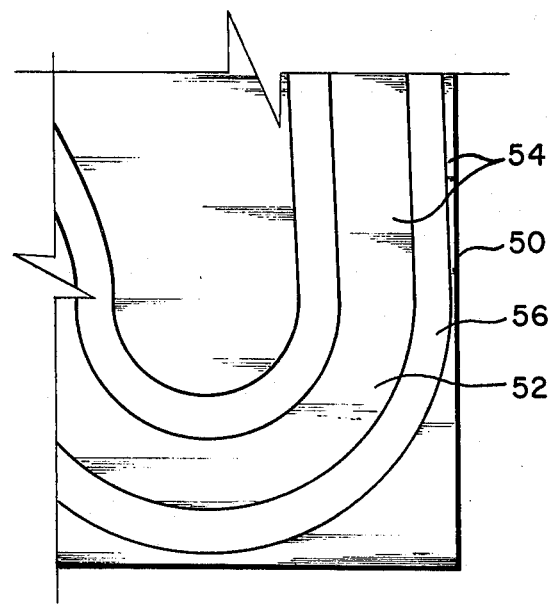
FIG. 3
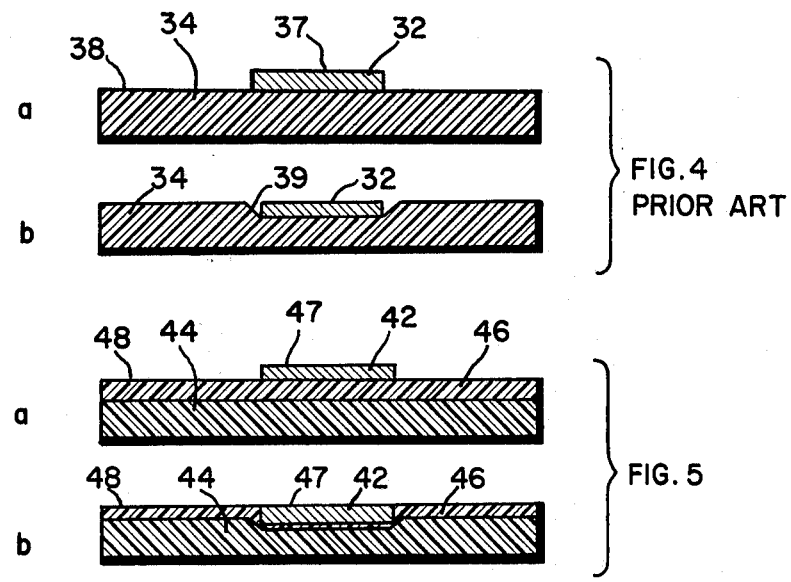

DIELECTRIC CIRCUIT BOARD BONDING

CROSS REFERENCE TO RELATED APPLICATION

This application is a continuation-in-part of applicant's prior application Ser. No. 315,037, filed Dec. 14, 1972, now abandoned, which is a C-I-P of application Ser. No. 52868 filed Dec. 14, 1972 now abandoned.

BACKGROUND OF THE INVENTION

In recent years, strip-line circuitry has found increasing applications in various items of hardware which are mass produced and which must operate under extreme environmental conditions. These applications have placed stringent requirements on the techniques used for packaging the circuitry. The strip-line packages must be capable of being assembled to produce uniform performance results not only at initial hardware acceptance but also after having been subjected to environmental extremes. Packaging techniques which have been and are being used have resulted in high rejection rates at initial hardware acceptance and degraded performance after environmental exposure.

This invention concerns the bonding of conductors to dielectric circuit boards for microwave applications and more particularly to the bonding of copper coating or foil to a substrate of glass-loaded polystyrene, divinyl benzol styrene, teflon or the like. A method of making a circuit board of the general type has been described in U.S. Pat. No. 3,318,758. However, the material used was not isotropic and had a water absorption factor which is highly objectionable in many microwave applications. Furthermore, the bonding process described in the patent necessitated the formation of a continuous coating of copper oxide on the copper sheet prior to bonding.

Numerous attempts have been made to provide a printed circuit board suitable for microwave use. Pure copper is known to be the best for use in such electrical circuits. Therefore, a laminate or printed circuit board formed of a layer of copper foil firmly bonded to a substrate of synthetic plastic material has been considered as providing an ideal board for microwave printed circuits.

The bonding of copper sheet or foil to a substrate of a dielectric material comprising a glass-loaded divinyl benzol styrene, for example, was conceived but presented many problems in the manufacture. Numerous attempts have been made by workers in this field to produce such a laminate, but to date these efforts have not been entirely successful. The relatively low softening temperature of the materials and the difficulty of bonding a proper foil to the materials without the use of cement have been given as reasons for failure. The successful manufacture of a circuit board of this configuration and the method for manufacture thereof is a subject of this invention.

A printed circuit board, in order to possess the physical and electrical characteristics required of microwave circuitry, must be stable in shape and dimension, have a low loss tangent, low isotropic dielectric constant, nil water absorption, high peel strength and chemical inertness. In addition, when the board is to be used with a wiper type switch arm, the surface of the copper should be flush with the surface of the dielectric, without a groove or trough between segments.

The method according to the present invention eliminates the use of fasteners and is accomplished without leaving air gaps and with no warping of the boards. The method produces boards having greater reliability with lower assembly costs and practically unlimited shelf life. The design performance of the boards is predictable, overall package size may be made smaller and orthogonal (shear) stresses do not exist on the circuiting.

As used herein, the term "plastic" includes any synthetic organic material of high molecular weight which, while solid in the finished state, at some stage in its manufacture is soft enough to be formed into shape by some degree of flow.

The well-known term "Teflon" as used herein is the trademark of the E. I. du Pont de Nemours and Company, Incorporated and refers to the plastic polymer tetrafluoroethylene as manufactured by them.

BRIEF DESCRIPTION OF THE SEVERAL VIEWS OF THE DRAWING

FIG. 1 is an exploded diagrammatic view illustrating the press set-up in a process according to the invention;

FIG. 2 is a diagram illustrating a recompression bonding cycle;

FIG. 3 is a plan view of a circuit board according to the invention;

FIG. 4 is a cross-sectional view of a circuit board made by prior art method; and FIG. 5 is a cross-sectional view of a printed circuit board fabricated according to the invention.

MATERIALS

The following dielectric materials have been used in bonding for rf circuits.

Polyguide

A low density irradiation cross-linked polyethylene available from Electronized Chemicals Corporation, South Bedford Street, Burlington, Massachusetts. Cross-linking by irradiation produces a thermosetting dielectric with decreased softening temperature, strength and resistance to cold flow. This dielectric is commonly referred to generically as polyolefin.

Polypropylene

In the polyolefin family; has a dielectric constant as low as 2.10; will withstand 100°F. higher temperature than the irradiated polyethylene and can be electroplated. Polypropylene may be produced at the lowest cost per pound of any of the dielectric materials now known to be useful without filling or irradiating for rf strip-line circuit boards. Polypropylene with random glass is useful for making flushed switches.

Duriod 5870

(Telflon/random glass microfibers), available from Rogers Corp., Robers, Connecticut.

Cu-Clad 6098

(Teflon/glass cloth plated with pure copper), available from Minnesota Mining and Manufacturing Company, St. Paul, Minnesota.

Custom Poly "C"

(cross-linked polystyrene), available from Custom Materials, Incorporated, Chelmsford, Massachusetts.

ABS (acrylonitrile-butadiene-styrene, electroplating grade with low dielectric constant), available from various manufacturers.

Rexolite 1422 and 2200

(cross-linked polystyrene), available from American Enka Corporation, Brand-Rex Division, Williamantic, Connecticut.

Tellite (polyethylene cross-linked by irradiation), available from Tell Manufacturing Company, Orange, New Jersey.

Epoxy Glass Filled Plastics Prepreg (glass cloth fibers saturated in uncured epoxy) partly cured epoxy sheets built up from prepreg with layers of copper bonded to one or both sides.

The irradiated polyethylene film (Polyguide) is preferred as the bonding medium between copper and substrate as well as between boards. This film has been chosen because of its electrical compatibility with treated Teflon-Fiberglas and many other circuit board material and with copper and aluminum, its dimensional stability, and its low softening temperature. The film used is typically 0.002 inches thick and is precut to the measurements of the boards being bonded. Rexolite makes a superior bond with a polystyrene film. Polypropylene requires a special polypropylene film for hot melt bond.

DETAILED DESCRIPTION OF THE INVENTION

The pressing arrangement:

A simplified diagrammatic illustration of a typical pressing mold assembly according to the invention is shown in FIG. 1. The top and bottom mold plates 12, 12' respectively are preferably made of copper and are placed next to the upper and lower press platens (not shown) respectively to provide flat and parallel surfaces within a tolerance of 0.0005 inches.

Next to the mold plates 12, 12' are photoplates 16, 16' respectively which have their polished surfaces facing each other in the stack. These photoplates or equivalent polished material provide a smooth, flush finish to ensure a smooth surface on the workpiece. The plate preferred is a brass plate with a highly polished plated finish. The plates 12, 12' and 16, 16' have been shown in a nondescript rectangular shape but in some applications may be cut to the exact size and shape of the inner dimensions 22 of the container plate 20.

The container 20 has an opening the size of the board to be flushed. A tolerance of +.010, −.000 is preferred. The thickness of the container will be related to the build-up required to contain the pressure and produce the finish required for a satisfactory laminated or flush circuit and is dependent upon the type of dielectric material being flushed or laminated.

The container is preferably made of brass to provide good thermal transfer in that area. In other words less heat will be present at the periphery of the mold or internal plug than through the central portion of the workpiece. This temperature differential reduces material flow at the edges and eliminates objectionable flashing.

Pads 14—14' comprising one or more thicknesses of Mylar or the like are placed between photoplates 16, 16' and the workpiece (not shown). Mylar (a copolyester film by du Pont) is most useful, for example, in the build-up on the plastic side of the board when the board to be laminated has copper on one side only. Mylar provides either a polished surface or a dull surface depending upon which is required. It will protect the photoplate from surface marks and serve as a leveling medium to correct the uneven thickness from the build-up in the container.

The mold plates 12, 12' and container plate 20 should have at least one horizontal hole drilled parallel to the center of the plate thickness and as deep as 1/2 of the plate size if practical for inserting a thermocouple (not shown) to measure the temperature. The container preferably should have two thermocouple holes through its outside frame permitting the thermocouple to touch the material therein on the edge. Thermocouples 0.062 diameter have been found to be most useful. The frame on the container plate should be from 1.5 inches minimum to 2.00 inches maximum.

The following dimensions give an example of the container thickness as related to the build-up of boards, photoplate and Mylar:

A. 0.020 in. photoplate + 0.000/-.005
B. 0.062 in. prepared circuit board to be flushed circuit down.
C. 0.014 in. Mylar polished side against board
D. 0.014 in. Mylar polished side against photoplate
E. 0.020 in. photoplate side down against
F. The thickness of the container section in this example was 0.130 inches +0.000,-.005 inches.

The normal allowance for pressing is 0.020 inches.

All plates for the mold must be parallel and flat within 0.0005 inches. The steam platens must be parallel and flat within 0.0005 inches. Any variation to these requirements will make the flushing of the circuits more difficult or impossible of making.

When the uneven thickness is more than 2 mils it is desirable to use brown paper for making pressing pads, cut to the size of the container, when for example the build-up produces 0.5 mils, 10 pieces of 5 mil paper or 5 pieces of 10 mil paper should make a satisfactory leveling pad in conjunction with at least two pieces of Mylar and with 2 pieces of photoplate. The circuit to be flushed, of course, should be in contact with the polished surface and the backside of the photoplate in contact with the mold plate.

PRESS AND PRESS CYCLE

The press can be any standard 2 platen laminating press with heating platens of sufficient design strength to withstand a maximum of 1500 psi at a maximum of 400°F. without losing their flat and parallel (0.001 maximum).

The heating medium can be steam, hot oil or electric providing the temperature can be sufficiently controlled when required. Besides the temperature controllers for each platen, the following indicators, recorders and/or controllers for the mold and container are desirable:

1 upper mold plate indicate/safety
1 lower mold plate indicate/safety
1 container plate recorder
1 container plate indicate/safety The temperature range of these instruments should be from 0°F to at least 600°F. or at least sufficient to work within the range of the temperatures provided by the platen heating system. The controls may be automatic or manual with timers for adjustable time frequencies up to 30 minutes minimum for the automatic timed sequence control and with pressure regulator controls for changing both temperature and pressure for a recompression cycle. The success of this novel method of laminating and flushing circuits depends upon the accuracy of the repeatable timed sequence.

The present process utilizes thermoplastic thin films and uncured or partly cured thin films of thermoplastic material as the bonding medium. An irradiated polyethylene film (Polyguide) is preferred because of its electrical compatibility with Teflon-Fiberglas and other synthetic plastic board material, its dimensional stability and its low softening temperature. The film used is typically 0.002 inches thick. Rexolite makes a superior bond with a polystyrene film. Polypropylene requires a special polypropylene film for hot melt bond.

The process is useful for flushing and for laminating copper/dielectric/copper or copper/dielectric with the automatic recompression cycle. While this type of function can be accomplished by manual operation or by partial automatic and part manual operation, the important thing in production is the timed repeatability for uniform production. Both the controls for recompression and the principle of the method are novel as related to laminating and flushing. The following timers are considered essential:

No. 1 timer controls heat cycle.
No. 2 timer controls hold or cure cycle.
No. 3 timer controls recompression cycle for pressure, temperature increase and return to hold temperature and pressure.
No. 4 timer controls the cooling cycle.

The cooling cycle for some dielectric plastic type materials, especially those which have had copper bonded to the surface and a circuit has been etched removing copper leaving residual stresses to make adjustment and particularly those which have been cross-linked either by chemical means or by irradiation are particularly susceptable to shrinkage in overall configuration and dimension. This is so serious that it is necessary to heat stabilize the boards after laminating to remove stresses in the copper and in the plastic which react by shrinkage either by environmental changes or just natural aging or when the circuit boards are bonded together in the assembly board stacks or antenna assembly. This is particularly true of microwave strip-line circuit board materials which are particularly sensitive to changes in circuit line lengths and width and the mismatching of features such as couplers and phase shifters. It has been found that by holding the board under an increased pressure (about 350 PSIG) during the cooling cycle after the temperature has dropped down to about 200° F. from 250° or 255° F., there is no tendency for the shrinkage of the boards. This increased pressure should remain on the boards until the mold temperature has been to a shock temperature below 35°F. This phenomenon also takes place when the same pressure increase and cold shock is applied to laminating copper to these same type of dielectric plastics for strip-line purposes. An extra timer and a hydraulic regulator must be provided for an automatic cooling cycle for these dielectrics.

A typical press cycle is illustrated in FIG. 2.

After the boards, copper and films are cleaned, they are placed in the container mold and placed in a heated platen press. Mylar shims 14, 14' are placed between the plates 16, 16' and the workpiece to assure that constant pressure is maintained on the package during the press cycle.

EXAMPLE 1

The materials to be laminated and the bonding film or films, having been properly cleaned and cut to size and shape, are placed in a stack in the confining mold and subjected to the following process.

a. The temperature of the stack is increased, over a span of 8 minutes, from a typical ambient of 70° to 250° for the FIG. 2 example. Meanwhile pressure is applied to 300 PSIG on the stack.

b. Pressure and temperature are maintained constant for a 5 minute dwell.

c. Temperature and pressure are raised briefly (E. G. 2 minutes) to 255° and 350 PSIG respectively.

d. Heat is removed but pressure is maintained at 350 PSIG until the stack has cooled to 230°;

e. Pressure is reduced to 300 PSIG and the stack is cooled to room temperature (70°) before pressure is removed.

EXAMPLE II

Four sets of boards were bonded using thin (0.002 in.) films of irradiated polyethylene with the press set to exert an initial pressure of 125 psi. After pressurizing, the temperature of the bonding mold was raised to 250°F. in a period of 7 minutes. The sets or stacks comprised two face to face circuit boards and two circuit free ground plane boards cut to size and punched for locator pins and the like. Identically sized and punched sections of bonding film were placed between the circuit boards and between the circuit board sandwich and the top and bottom ground planes. Bonding temperature and pressure were initially selected so that critical package cross-sectional geometry could be preserved, board expansion and press temperature cyling times could be minimized, and damage would not occur to coupler terminations. The center spacer thickness in the three-layer package was 0.015 inches, and circuit performance parameters required that this dimension not vary more than 6%. The ground planes were 0.0625 inches thick.

After the strip-line sandwich reached 250°F., it was held at that temperature for a period of 5 minutes. The mold was then cooled to 95°F. in 14 minutes. At this point the pressure on the sandwich was removed and the sample taken from the mold.

Three sets of Cu-Clad boards (sets 1, 3, and 4) were bonded in the manner described above, and one set (2) was bonded in the same manner except that it was stabilized at 250°F. for 10 minutes rather than 5. The circuitry on sets 1 and 2 was modified from the configuration normally used in strip-line packages. On these sets support copper completely surrounded all of the circuitry 52 (FIG. 3). The principal reason for increasing the copper area was to provide an optimum bond surface. Past experience has shown that the polyolefin bonding film bonds much better to copper than it does to Teflon. The additional support copper 54 on the boards 50 also serves to dimensionally stabilize the boards during and after the etching process.

The circuitry on sets 3 and 4 was conventional (no surrounding copper). The Teflon-Fiberglas on set 4 was treated by priming in sodium naphthalene for 5 minutes prior to bonding.

The bond integrity of the four sets of boards was evaluated by submitting the boards to the following testing process:

1. A hole pattern was drilled through the boards to provide uniform coverage of the bond line.
2. The mechanically unsupported boards were temperature shocked at −65°F and +160°F, and were then cycled ten times from −40°F to +130°F.
3. After the temperature cycle the boards were immersed in fluorescent dye so that any bond voids around the drilled holes or the perimeter of the boards could be detected after the boards were separated.
4. The boards were cut into strips and the strips were pulled apart on a tensile testing machine.
5. The boards were examined under regular light and untraviolet light to determine if any bond-line voids existed.

It was felt that temperature cycling the sets without any mechanical supports would subject the boards to the worst-case environmental stress that they might be expected to encounter in use. Linear expansion forces on each of the boards in the strip-line package can exert tremendous force on the bond line. Bond degradation may be detected by warpage or twisting of the strip-line deck, variation in individual board diameters, poor board peel strength, bond separation, and bond-line voids.

Examination of the decks according to the process outlined above revealed that a very good bond was obtained on sets 1 and 2. Set 3 had a poor bond and exhibited delamination after the temperature cycle. Set 4 had a reasonably good bond. No warpage, twisting, delamination, or variation in individual board diameters could be detected on sets 1, 2, and 4.

EXAMPLE III

As shown in FIGS. 4 and 5, when circuit boards such as 38 and 48 respectively are to be used with a wiper type switch arm, the surface of the conductors 37, 47 must be flush with the surface of the finished board.

In prior art processes, a trough or depression 39 usually surrounded the conductor in the finished board as shown in FIG. 4 and this configuration was found to be highly unsatisfactory for many reasons. According to the present invention, a copper clad dielectric board is first prepared by laminating copper foil 42 to substrate 44 by an interposed bonding film 46 of a thermoplastic such as polypropylene or an uncured or partly cured thermosetting material termed prepreg. When the substrate comprises a thermosetting epoxy resin material the bonding film is a thin prepreg which bonds to the copper and the substrate at temperatures below that needed to fully cure the epoxy. Also, in the case of a thermoplastic substrate such as Polyglass the copper is bonded thereto by a film of adhesive polypropylene at only enough heat and pressure to give a dimensionally stable board under the conditions of etching. Through experimentation, optimum press times may be arrived at to cure or set the stack only enough to sufficiently hold the copper flat and secure for etching.

When this composite board is etched, the resulting circuit board is placed face down in a stack and run through a pressing cycle as in Example I above. The result is a flush surface board, with surface 47 of the copper 42 and surface 48 of the composite board being flush and level, the film and substrate becoming fully cured or set in the process.

During the bonding studies it was revealed that temperature was the most critical parameter in the press cycle. Variations in temperature as small as 5°F significantly affect the bond and or the core.

Two boards may be bonded face-to-face to form integral circuits and by placing discrete amounts of preformed low temperature solder between mating connections, the conductors may thus be electrically bonded during the process through preformed openings in the bonding film.

One approach for joining decks together and providing circuit continuity is to bond a piece of wire screen between two pieces of bonding film and put this sandwich between the decks to be joined. The decks can then be bonded together in the same way as individual boards. The nodes of the screen wire penetrate the bonding film during the pressing cycle and provide the necessary ground continuity. Another approach uses conductive bonding films of metal impregnated plastic.

Boards formed by the above process may be held together by metal plating the walls of a plurality of coaxial holes such as the visual locator pin holed drilled in the boards.

What is claimed is:

1. A process for the manufacture of microwave strip-line circuit boards or the like including:
    A. attaching together a relatively thick, partly cured dielectric substrate of thermosetting plastic material and a sheet of bonding film consisting essentially of an electrically compatible heat settable plastic about 0.002 in. thick to form a dielectric laminate;
    B. attaching a conductive foil to said film to form a clad composite board;
    C. pressing said composite board between temperature controlled press plates sufficiently to cause said conductive material and said substrate to be adhered by said film while said substrate remains partly uncured;
    D. etching away portions of said conductive material to form a desired electrical circuit;
    E. machining said board to finished size and shape;
    F. placing the etched and machined board in a mold container confining said board in all dimensions;
    G. pressing the board at a controlled temperature and pressure sufficient to completely cure said film and substrate and cause said conductor and said film to form together a flush level board surface.

2. The process of claim 1 wherein said conductive foil is copper and said bonding film is a dry plastic sheet of irradiation cross-linked polyethylene.

3. The process of claim 2 wherein said substrate panel is a glass loaded sheet of tetrafluoroethylene.

4. The process of claim 1 wherein said temperature controlled plates are successively heated to about 250°F., held under 300 PSIG pressure for a predetermined time and then shock cooled to about 70°F before decreasing the pressure and removing the board from the press.

5. The process of claim 4 wherein said conductive foil is copper and said bonding film is a dry plastic sheet of irradiation cross-linked polyethylene.

6. The process of claim 5 wherein said substrate panel is a glass loaded sheet of tetrafluoroethylene.

7. The process of claim 1 including:
    G. placing two such boards with their conductor sides facing in a confining mold with at least one commensurate sheet of polyolefin bonding film therebetween forming a stack;

H. pressing the stack and elevating the temperature to bond the two boards.

8. The process of claim 7 further including:

I. placing a soft solder between portions of the conductors on the respective boards before pressing and heating to a temperature sufficient to melt said solder and electrically bind said conductors.

9. The process of claim 7 wherein said temperature controlled plates are successively heated to about 250°F., held under a pressure of about 300–350 PSIG for a predetermined time and then cooled before removing said stack from the press.

10. The process of claim 9 wherein:

the temperature of said plates is elevated to 251°F. during a period of about 7 minutes;

the pressure of said plates is raised during said period to 125 PSIG;

the pressure and temperature is held constant for 5 minutes;

and thereafter rapidly cooling said plates to about 95° before decreasing the pressure and removing said stack from the press.

11. The process of claim 10 wherein said conductive foil is copper and said bonding film is a dry plastic sheet of irradiation cross-linked polyethylene.

12. The process of claim 11 wherein said substrate panel is a glass loaded sheet of tetrafluoroethylene.

13. A process for the manufacture of circuit boards or the like including:

A. bonding together a glass loaded plastic substrate panel of tetrafluoroethylene and a sheet of conductive copper foil by means of an interposed bonding film consisting essentially of a dry sheet of irradiation cross linked polyethylene to form a clad dielectric board;

B. machining sections of said board to a finished size and shape desired;

C. removing only sufficient patterned portions of the conductive foil from the surface of said sections to provide on those sections discrete circuit paths and leaving said circuit paths surrounded by supportive foil separated from said circuit paths;

D. placing two of said selected sections foil face to foil face with a piece of electrically compatible heat settable bonding film between said foil faces to form a stack with said bonding film conforming to all peripheral dimensions and any internal shapes of said sections;

E. placing said stack in a container mold having inner dimensions such as to closely receive and confine the components of said stack;

F. further confining said stack by means of top and bottom mold members closely fitting within said container mold;

G. heating and pressing said stack to about 250°F within the confinement of said mold; and H. chilling said mold and stack while still under pressure until the temperature of said stack drops to about 70°F or below before releasing pressure and removing the stack form the mold.

* * * * *